(12) United States Patent
Kondo

(10) Patent No.: US 6,775,082 B2
(45) Date of Patent: Aug. 10, 2004

(54) DIGITAL VFO PHASE CONTROL DEVICE

(75) Inventor: Tomokazu Kondo, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 437 days.

(21) Appl. No.: 09/836,196

(22) Filed: Apr. 18, 2001

(65) Prior Publication Data

US 2002/0021518 A1 Feb. 21, 2002

(30) Foreign Application Priority Data

Apr. 19, 2000 (JP) ........................................ 2000-118671

(51) Int. Cl.$^7$ ............................ G11B 5/09; G11B 27/36
(52) U.S. Cl. ............................. 360/51; 360/46; 360/55; 360/48; 360/31; 360/39; 360/40
(58) Field of Search ............................. 360/46, 51, 55, 360/53, 48, 31, 39, 40

(56) References Cited

FOREIGN PATENT DOCUMENTS

| JP | 63-237201 | 10/1988 |
|---|---|---|
| JP | 64-47127 | 2/1989 |
| JP | 01272324 | 10/1989 |
| JP | 3-227123 | 10/1991 |
| JP | 4-310675 | 11/1992 |
| JP | 5-242610 | 9/1993 |
| JP | 5-303706 | 11/1993 |
| JP | 7-56717 | 6/1995 |
| JP | 2560406 | 9/1996 |
| JP | 10-283737 | * 10/1998 |

OTHER PUBLICATIONS

Guonai et al, "Novel Phase Locked Loop with Digital Control Techniques", May 8–11, 1989, IEEE International Symposium Circuits and Sytems, vol. 2, pp. 1411–1414.*
Fuminori et al, "Efficient Digital Techniques for Implementing a Class of Fast Phase–Locked Loops (PLL's)", Dec. 1996, IEEE Transactions on Industrial Electronics, vol. 43, No. 6, pp. 616–620.*

* cited by examiner

Primary Examiner—David Hudspeth
Assistant Examiner—Natalia Figueroa
(74) Attorney, Agent, or Firm—McGinn & Gibb, PLLC

(57) ABSTRACT

A digital VFO phase control device comprising: an output signal generation means for generating an output signal having the predetermined phase relationship with an input signal of the digital VFO phase control device, a phase difference detection means for detecting a phase difference between the input signal and the output signal, a first correction value output means for outputting a correction value for correcting a phase of the output signal based on a phase difference detected by the phase difference detection means, a second correction value output means for outputting a preset correction value for correcting a phase of the output signal based on a phase difference detected by the phase difference detection means, a comparison means for detecting whether or not the phase difference detected by the phase difference detection means being within a predetermined range, and a correct value selection means for selecting either one of a correction value outputted by the first correction value output means and a correction value outputted by the second correction value output means based on a comparison result of the comparison means, and controlling a phase of the output signal.

14 Claims, 7 Drawing Sheets

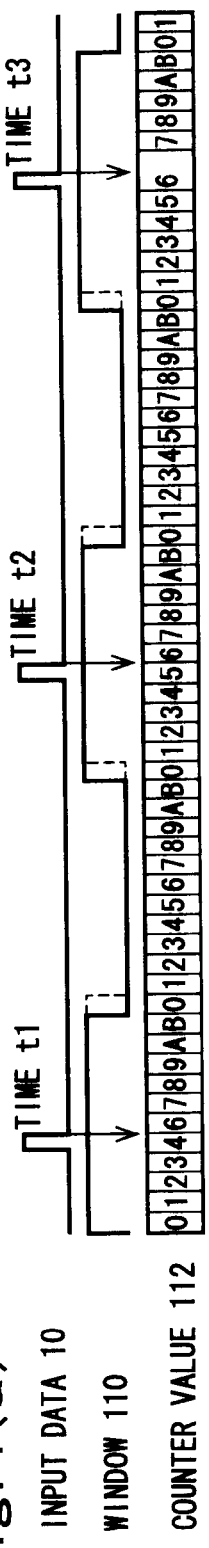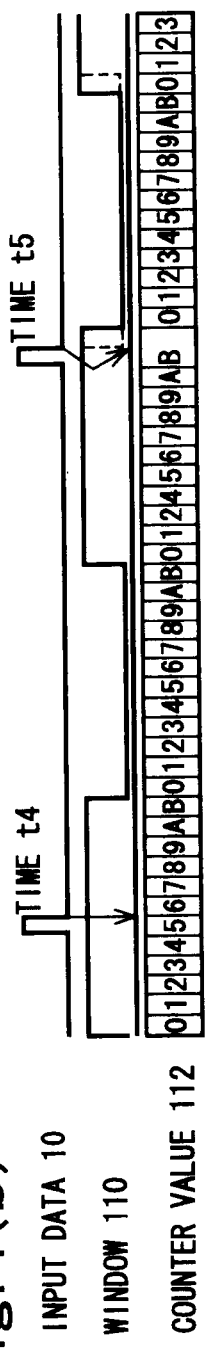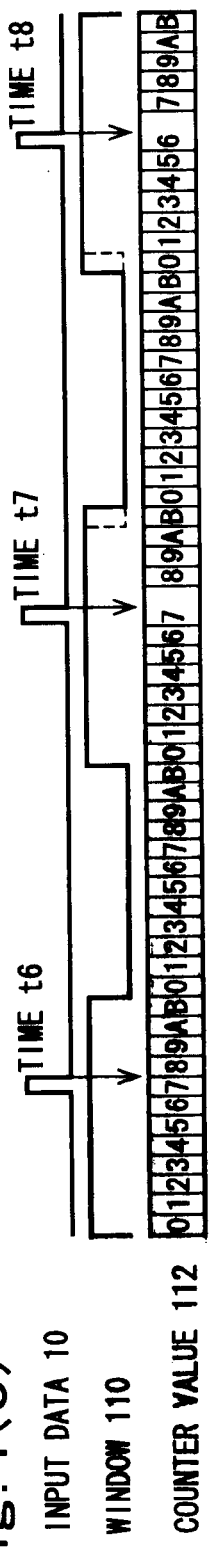

| AVERAGE VALUE (114) | 0 | 1 | 2 | 3 | 4 | 5 | 6 | 7 | 8 | 9 | 10 | 11 |
|---|---|---|---|---|---|---|---|---|---|---|---|---|
| CORRECTION VALUE (62) | N+2 | N+2 | N+1 | N+1 | N+1 | N | N-1 | N-1 | N-1 | N-1 | N-2 | N-2 |
| CORRECTION VALUE OF FIG.1 (115) | N+2 | N+2 | N+1 | N+1 | N | N | N | N-1 | N-1 | N-2 | N-2 | N-3 |

DIGITAL VFO PHASE CONTROL DEVICE

BACKGROUND OF THE INVENTION

1. Field of the Invention

The present invention relates to a phase control device of a digital VFO and particularly relates to a digital VFO phase control device capable of detecting the phase shift of input data and generating an optimum phase relationship between input data and output WINDOW pulse with a simple circuit arrangement in the phase correction in a digital VFO during serial data reproduction.

2. Description of Related Art

A VFO (Variable Frequency Oscillator) is employed particularly when the data of a magnetic recording disk is reproduced.

The VFO is normally realized by an analog circuit. The analog circuit is required to adjust a resistance value and a capacitive value, so that it is difficult to design the analog circuit and it is difficult to reduce a chip area.

Recently, demand for digitizing a VFO rises. To meet this demand, there is proposed digitizing a VFO using a counter as disclosed by, for example, Unexamined Japanese Patent Publication (KOKAI) No. 3-227123.

The circuit disclosed by the above Unexamined Japanese Patent Publication is shown in FIG. 7.

In FIG. 7, reproduced data (31) is a signal outputted from a floppy disk drive. A scaling circuit (32) generates reference data (32a) having a width of one clock relative to a reference clock from the reproduced data (31) using the reference clock. A counter circuit (33) is a binary counter having a reset function for incrementing a counter value by the reference clock. A symbol MSB indicates the most significant bit. A D-type flip-flop (34) serves as a divider and generates an output clock. The output clock in FIG. 7 corresponds to a WINDOW pulse (110) shown in FIG. 1.

Description will now be given while taking a case where a data transfer rate is 500 Kbps and the reference clock shown in FIG. 7 (corresponding to a system clock (20) shown in FIG. 2) has a frequency of 12 MHz as an example.

In this case, if the cycle of the counter (33) generating output clocks is set at 12 in decimal system, the cycle of input data accords with that of an output clock.

In a circuit shown in FIG. 7, a counter value is set at 6 so that reproduced data is at the center of either the High width or Low width of the output clock per reproduced data to promptly make a phase correction. Due to this, if a peak shift which is the feature of data recorded magnetically is included in the reproduced data, an erroneous correction is made, thereby make it disadvantageously impossible to accurately reproduce data.

An example of an erroneous correction to the peak shift pair in the constitution of FIG. 7 is shown in FIG. 8. An output clock indicated by a solid line in FIG. 8 shows a waveform when the peak shift is erroneously corrected and an output clock indicated by a dotted line shows a waveform when the peak shift is not corrected. It is assumed that the data to be reproduced is "11" and that a peak shift in which these both bits shift in the opposite direction from the center occurs.

Originally, if reproduced data occurs, the output clock should be outputted at High timing. In the example of the constitution shown in FIG. 7, if a peak shift occurs, the reproduced data at a time t10 is deviated from the High timing of the output clock.

SUMMARY OF THE INVENTION

It is an object of the present invention to provide a new digital VFO phase control device characterized in that the disadvantages of the conventional technique stated above can be overcome, and the phase shift of input data can be detected and an optimum phase relationship between input data and output WINDOW pulse can be generated with a simple circuit constitution in the correction of the phase of the digital VFO during serial data reproduction, and particularly an optimum phase relationship between input data and an output WINDOW pulse can be maintained without being influenced by a peak shift and a sudden phase shift.

To obtain the above object, the present invention basically adopts the following technique constitution.

The first aspect of the present invention is a digital VFO phase control device comprising: an output signal generation means for generating an output signal having the predetermined phase relationship with an input signal of the digital VFO phase control device, a phase difference detection means for detecting a phase difference between the input signal and the output signal, a first correction value output means for outputting a correction value for correcting a phase of the output signal based on a phase difference detected by the phase difference detection means, a second correction value output means for outputting a preset correction value for correcting a phase of the output signal based on a phase difference detected by the phase difference detection means, a comparison means for detecting whether or not the phase difference detected by the phase difference detection means being within a predetermined range, and a correct value selection means for selecting either one of a correction value outputted by the first correction value output means and a correction value outputted by the second correction value output means based on a comparison result of the comparison means, and controlling a phase of the output signal utilizing said selected correction value.

In the second aspect of the present invention, the output signal generation means comprises a counter.

In the third aspect of the present invention, the first correction value output means comprises a phase difference averaging means for averaging phase differences detected by the phase difference detection means and a correction value calculation means for obtaining the correction value based on an average value calculated by the phase difference averaging means, and the correction value calculation means includes an arithmetic operation means for preventing excessive correction.

In the fourth aspect of the present invention, the first correction value output means obtains the correction value from an expression of $\{n+(C-A)/M+1\}$, where n is a counter value of the counter when the phase difference detection means receiving the input signal, C is a pre-established value, A is an average value calculated by the phase difference averaging means, and M is a coefficient for preventing excessive correction.

In the fifth aspect of the present invention, the pre-established value C is equal to MAX/2, where MAX is maximum value of the counter.

BRIEF DESCRIPTION OF THE DRAWINGS

FIG. 4(a) shows an operation example when a phase of a window pulse is corrected, FIG. 4(b) shows an operation example of a phase correction using an average value and FIG. 4(c) shows an operation example of a phase correction when a phase deviation occurs.

DESCRIPTION OF THE PREFERRED EMBODIMENTS

Figure 1:
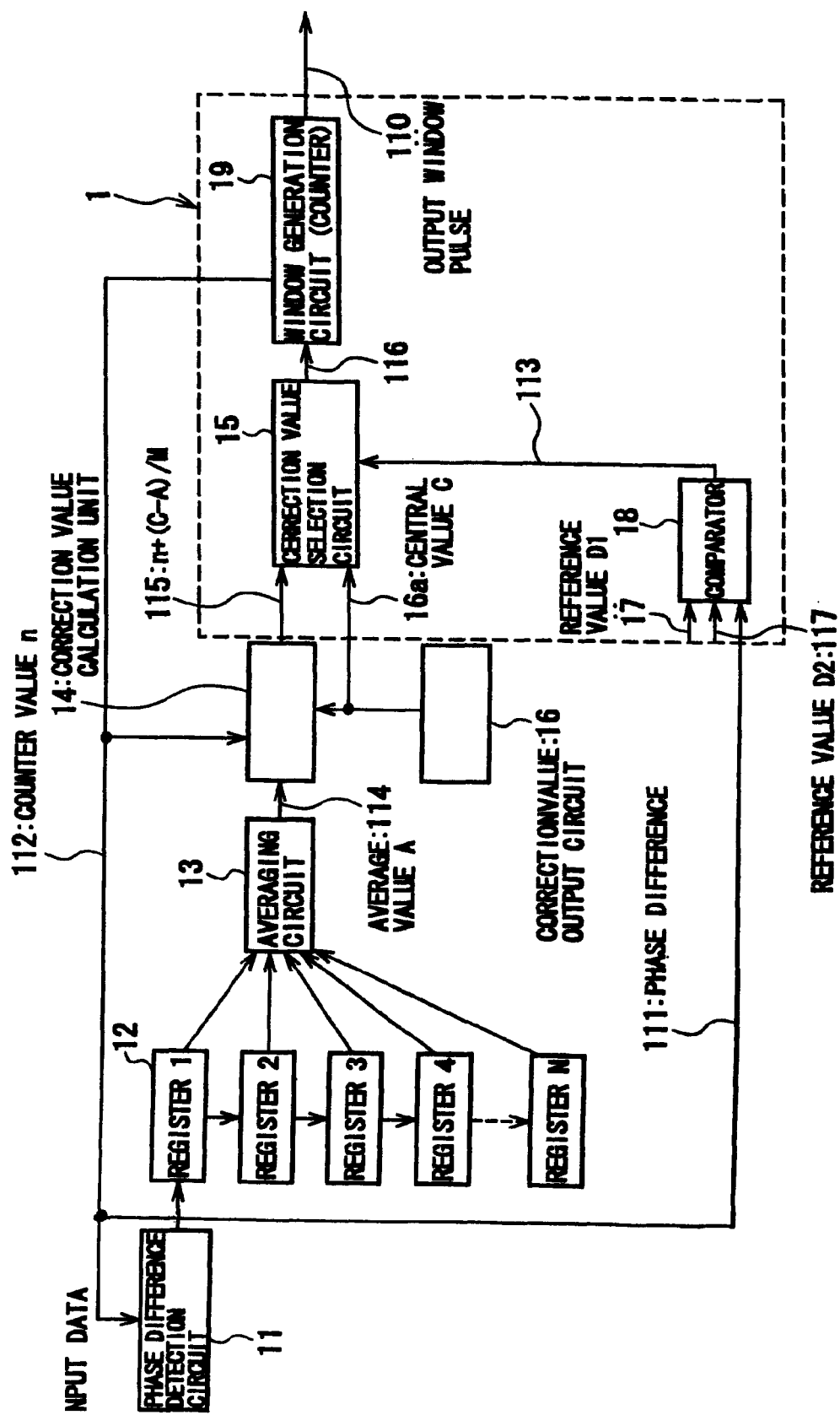
FIG. 1 is a block diagram showing a digital VFO phase control device according to the present invention.

A digital VFO phase control device according to the present invention is characterized in that the phase shift of input data can be detected and an optimum phase relationship can be generated with a simple circuit constitution in the correction of the phase of the digital VFO during serial data reproduction, and particularly an optimum phase relationship between input data and output WINDOW pulse can be maintained without being influenced by a peak shift and a sudden phase shift.

The present invention will be described with reference to FIG. 1.

Serial data (10) from a disk drive is inputted into a phase difference detection circuit (11) and the phase difference between the serial data (10) and a WINDOW pulse (110) generated by the VFO is detected. The detected phase difference is stored in registers (12) for N times and an average value A (114) of the phase differences of N times is calculated by an averaging circuit (13).

Here, the difference between the calculated average value A (114) and a central value C (16a) is obtained by an arithmetic unit (14), the obtained difference is divided by a constant M, and the division result is added to a counter value n (112).

The output (115) of the arithmetic unit (14) is inputted into a correction value selection circuit (15).

The correction value selection circuit (15) selects a correction value based on the output (113) of a comparator (18).

The comparator (18) compares a reference value D1 (17) and a reference value D2 (117) with the counter value (112) of the counter (19) and determines whether or not the counter value is within a preset range.

Based on the output (113) of the comparator (18), the correction value selection circuit (15) selects the central value C (16a) of the WINDOW pulse as a correction value if the counter value (112) is within the predetermined range, but otherwise selects the output (115) of the arithmetic unit (14).

A WINDOW generation circuit (19) corrects the phase relationship between the WINDOW pulse (110) and the input data (10) based on the output (116) of the correction value selection circuit (15).

By constituting the phase control device as stated above, it is possible to maintain an optimum phase relationship between the input data (10) and the output WINDOW pulse (110) without excessively reacting to one peak shift and a sudden phase shift.

[Embodiments]

The embodiments of the digital VFO phase control device according to the present invention will be described hereinafter in detail with reference to the accompanying drawings.

(First Embodiment)

FIGS. 1 to 4 shows the first embodiment of the digital VFO phase control device according to the present invention. In FIGS. 1 to 4, there is shown a digital VFO phase control device comprising: an output signal generation means (19) for generating an output signal (110) having the predetermined phase relationship with an input signal (10) of the digital VFO phase control device, a phase difference detection means (11) for detecting a phase difference between the input signal (10) and the output signal, (110) a first correction value output means (13, 14) for outputting a correction value (115) for correcting a phase of the output signal based on a phase difference (111) detected by the phase difference detection means (11), a second correction value output means (16) for outputting a preset correction value (16a) for correcting a phase of the output signal based on a phase difference (111) detected by the phase difference detection means (11), a comparison means (18) for detecting whether or not the phase difference (111) detected by the phase difference detection means (11) being within a predetermined range (D1–D2), and a correct value selection means (15) for selecting either one of a correction value (115) outputted by the first correction value output means (13, 14) and a correction value (16a) outputted by the second correction value output means (16) based on a comparison result (113) of the comparison means (18), and controlling a phase of the output signal (110).

There is also shown a digital VFO phase control device characterized in that the output signal generation means (19) consists of a counter.

Further, there is shown a digital VFO phase control device characterized in that said first correction value output means (13, 14) consists of a phase difference averaging means (13) for averaging phase differences of N times, and correction value calculation means (14) for obtaining the correction value (16a) based on an average value calculated by the phase difference averaging means (13), the correction value calculation means (14) having arithmetic operation means (14a) for preventing excessive correction.

Now, the first embodiment will be described in more detail.

As shown in FIG. 1, the digital VFO phase control device according to the present invention includes a phase difference detection circuit (11) detecting the phase difference between input data (10) from a drive device (not shown in the drawing) and an output WINDOW pulse (110), N registers (12) holding phase differences of N times, an averaging circuit (13), an arithmetic operation unit (14), a correction value selection circuit (15), a comparator (18) and a WINDOW generation circuit (19).

When the input data (10) occurs, the phase difference detection circuit (11) detects the counter value n (112) of the WINDOW generation circuit (19) so as to detect the phase difference (111) between the WINDOW pulse (110) and the input data (10). A group of registers (12) hold the phase differences of N times detected by the phase difference detection circuit (11).

The averaging circuit (13) calculates the average value A (114) of the phase differences of N times stored in the group of registers (12).

The arithmetic operation unit (14) obtains the difference between the average value A (114) calculated herein and a WINDOW central value C (16a), then divides the difference by M and adds the division result to the present counter value n (112).

If an input data string is expected to have a relatively large peak shift, the value of the divisor M may be set high and if a frequency deviation rather than the peak shift is expected to be relatively great, the value of the divisor M may be set low.

The output (115) of the arithmetic operation unit (14) is inputted into the correction value selection circuit (15).

The correction value selection circuit (15) selects a correction value based on the output signal (113) of the comparator (18).

The comparator (18) compares a reference value D1 (17) and a reference value D2 (117) with the output (111) of the phase difference detection circuit (11) and determines whether or not the phase difference is within a preset range. This range may be set narrow if it is expected that an input data string has a relatively large peak shift and may be set wide if a frequency deviation rather than the peak shift is expected to be relatively great. Namely, in the present invention, it is possible to provide correction characteristics according to the characteristics of the input data string by a combination of the divisor M and the correction range.

If the comparison result of the comparator (18) detects that the phase difference is within the predetermined range, the correction value selection circuit (15) selects, as a correction value, the central value C (16a) of the WINDOW pulse, otherwise selects, as a correction value, the output (115) of the arithmetic operation unit (14) and outputs the selected correction value to the WINDOW generation circuit (19).

The WINDOW generation circuit (19) corrects the phase relationship between the WINDOW pulse (110) and the input data (10) based on the output (116) of the correction value selection circuit (15).

Figure 2:
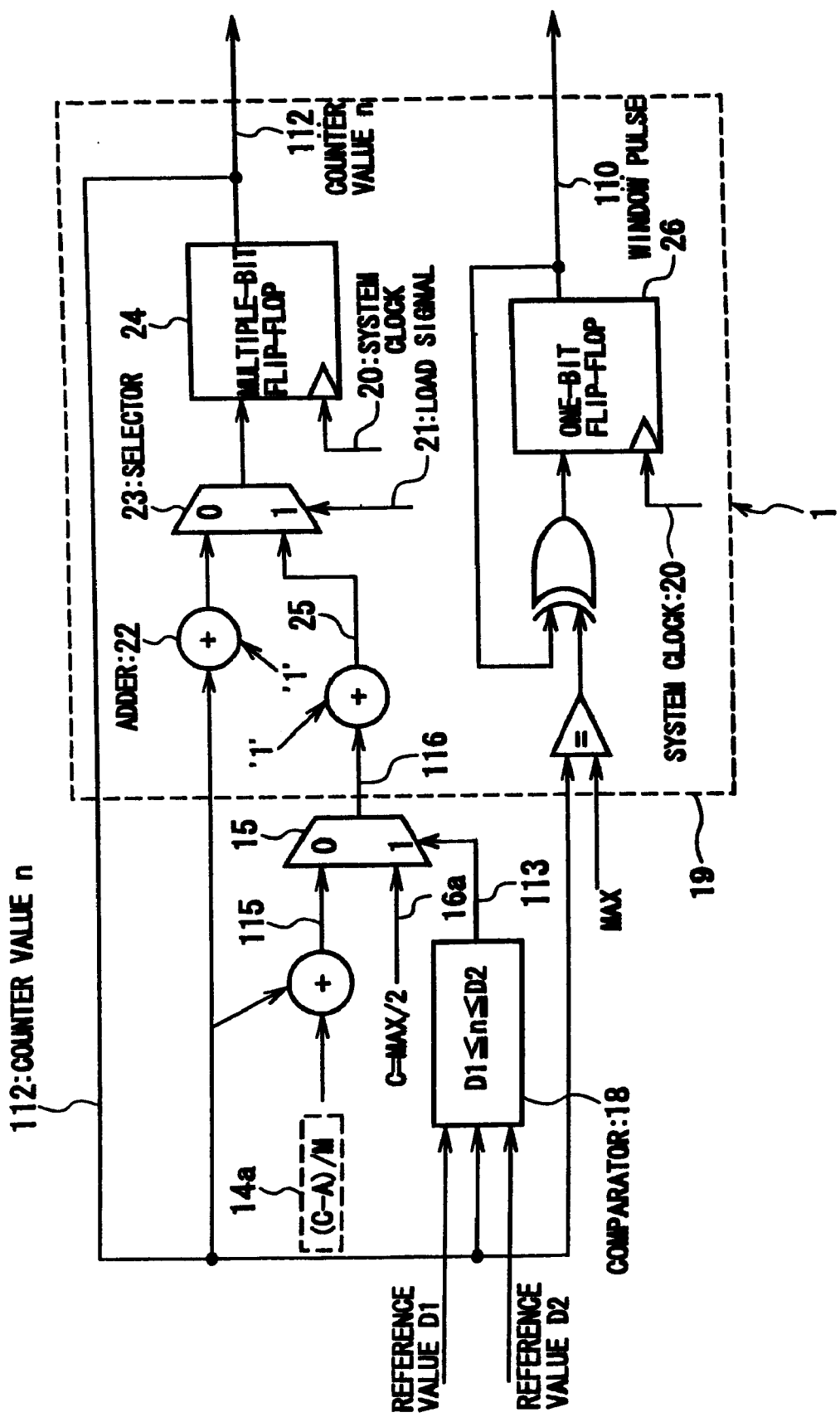
FIG. 2 is a detailed circuit diagram showing a portion surrounded by a dotted line of FIG. 1.

FIG. 2 shows an example of a block diagram of a portion surrounded by a dotted line of FIG. 1 in more detail.

In FIG. 2, if the counter value n (112) generated by a multiple-bit flip-flop (24) accords with a MAX value set by a data transfer rate and the frequency of a system clock (20), the WINDOW pulse (110) is inverted.

When a load signal (21) is at a LOW level, the counter value n (112) is incremented synchronously with the system clock (20) because an adder (22) is provided.

When input data (10) is input from the disk drive, the load signal (21) becomes a HIGH level and a selector (23) selects a correction value (25) and outputs the correction value (25) to the WINDOW generation circuit (19).

The correction value (25) is selected by the selector (23). If the counter value n (112) is within a prescribed range (D1≦n≦D2), a value (C+1)={(MAX/2)+1} obtained by adding "1" to the central value C (16a) of the counter (24) is assigned to the multiple-bit flip-flop (24) as a correction value (25), otherwise a value {n+(C−A)/M+1} obtained by adding "1" to the output (115) of the arithmetic operation unit (14) shown in FIG. 1 is assigned to the multiple-bit flip-flop (24) shown in FIG. 2 as a correction value (25).

Figure 3:
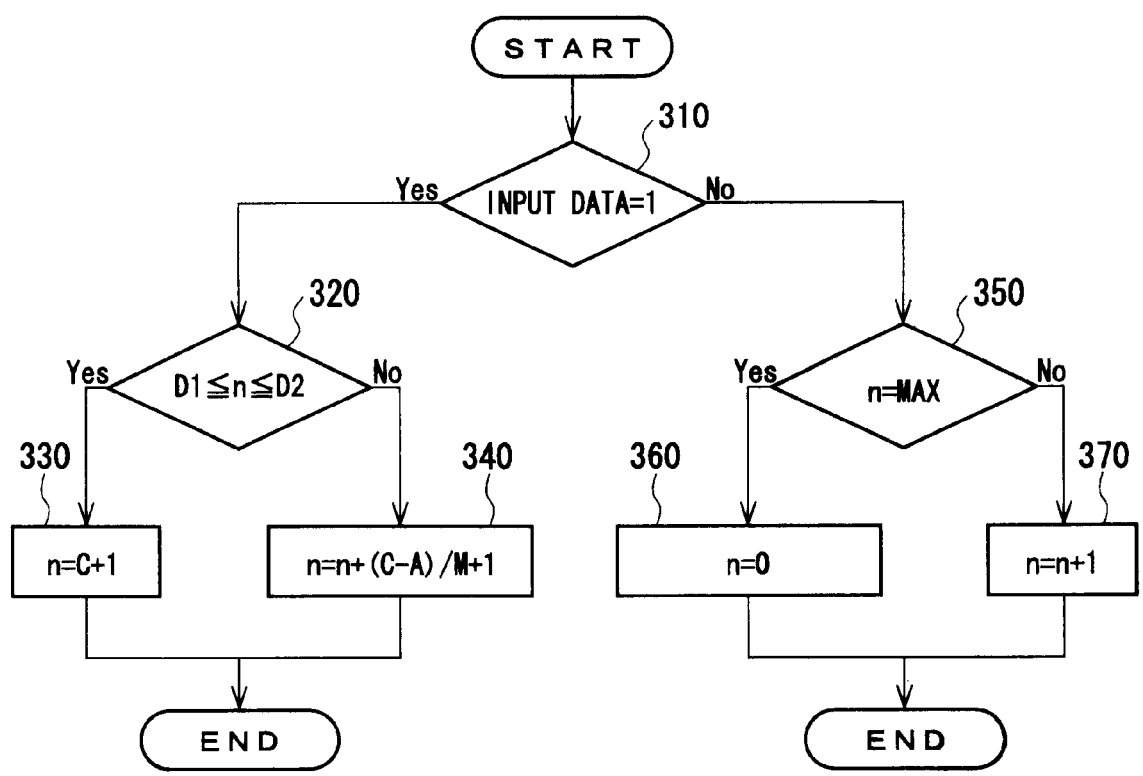
FIG. 3 is a flow chart for describing the operation of the present invention.

The above-stated operation will be described further with reference to a flow chart shown in FIG. 3.

That is, it is first determined whether or not input data (10) occurs (Step 310). If the input data (10) occurs, it is determined whether or not the counter value n (112) is within a range of D1≦n≦D2 (Step 320). If the counter value n (112) is within the range of D1≦n≦D2, (C+1) is assigned to the counter value n (112) at the next clock (Step 330), where C (=MAX/2) is the central value of the WINDOW pulse, otherwise a value {n+(C−A)/M+1} obtained by adding "1" to the output (115) of the arithmetic operation unit (14) shown in FIG. 1 is assigned to the counter value n (112) (Step 340).

In any case, the counter value n (112) when the input data (10) occurs is stored in the N registers (12).

On the other hand, when the input data (10) does not occur and the counter value n (112) is not equal to the MAX value established by the data transfer rate and the frequency of the system clock (20), the counter value n (112) is incremented synchronously with the system clock (20) (Step 350, 370). When the counter value n (112) becomes to be MAX (n=MAX), the counter is reset and, at the same time, the WINDOW pulse (110) is inverted according to an expression (Step 360).

Now, the operation of this embodiment will be described.

With the constitution shown in FIG. 1, if read data transfer rate is 500 Kbps and the frequency of the system clock (20) shown is 12 MHz, the multiple-bit flip-flop (24) shown in FIG. 2 may be operated as a duodecimal counter and the WINDOW pulse (110) maybe inverted whenever the counter makes a round so as to accord the WINDOW pulse with an ideal transfer rate. If the input data (10) occurs while the counter value n (112) is "5", an ideal phase relationship without a peak shift is established.

In the registers (12) storing phase differences of N times, N is set at 2 and the divisor M of the arithmetic operation unit (14) is set at 2.

Further, to select a correction value, the reference values D1 (17) and D2 (117) inputted into the comparator (18) are set to be ±1 relative to the central value. Namely, since the central value is "5", D1=4 and D2=6 in FIGS. 1 and 2.

In the above-stated case, a phase correction operation without using an average value will be described first with reference to a timing chart shown in FIG. 4(a).

It is assumed that the counter value n (112) is 4 when the input data (10) shown in FIG. 1 occurs at time t1. At this time, the counter value n (112) is within the range (4<n<6) set by the reference values D1 (17) and D2 (117). Due to this, based on a correction value select signal (113) generated by the comparator (18), the correction value selection circuit (15) selects and outputs, as a correction value (116) assigned to the WINDOW generation circuit (19), a counter value of "6" corresponding to {(central value of WINDOW pulse)+1}.

Likewise, if the counter value n (112) is 5 or 6 when the input data (10) occurs (at time t2 or t3 in FIG. 4(a)), "6" is assigned to the multiple-bit flip-flop (24) at a clock next to the clock at which the input data (10) occurs irrespectively of the value of the output (115) of the arithmetic operation unit (14). A dotted line shown in FIG. 4(a) indicates the waveform of the WINDOW pulse if no correction is made.

Next, description will be given to a phase correction operation using an average value with reference to a timing chart shown in FIG. 4(b).

First, it is assumed that the counter value n (112) is "5" when the input data (10) occurs at time t4 (at which time, "6" is assigned as a phase correction value at the next clock) and that a peak shift occurs and the counter value n (112) is "11" when the input data (10) occurs at time t5. Then, the value assigned to the counter value n (112) at the next clock is {n+(C−A)/M+1}, i.e., 11+{5−(5+11)/2}/2+1=11. Thus, compared with a value without correction, the width of the WINDOW pulse is corrected to be extended by one clock.

Next, a timing chart shown in FIG. 4(c) will be described.

In FIG. 4(c), the counter value n (112) is "7" when the input data (10) occurs at time t6 (to simplify description, it is assumed that no correction is made at time t6), and the counter value n (112) is also 7 when the input data (10) occurs at the next time t7. This does not show a peak shift state but shows a state in which only the phase is shifted by "2" from the ideal relationship while the cycle is the same. At this time, the value assigned to the counter value n (112)

at a clock next to the clock at which the input data (10) occurs at the time t7 is [7+{5−(7+7)/2}/2+1]=7 and the WINDOW pulse (110) is extended by one clock compared with a case where no correction is made. In this example, the cycle of the input data (10) accords with that of the WINDOW pulse (110). Due to this, the counter value n (112) becomes "6" when the input data (10) is inputted at the next time t8, which value is within the range (4≦n≦6) preset by the reference values D1 (17) and D2 (117). Thus, "6" is assigned to the counter value n (112) at the next clock, thereby establishing an ideal phase relationship between the input data (10) and the WINDOW pulse (110).

In the above-stated example, description has been given while taking a case where the divisor M of the arithmetic operation unit (14) is 2 as an example. The value of the divisor M may be set high if it is expected that an input data string has a relatively large peak shift and may be set low if it is expected that a frequency deviation rather than the peak shift is relatively great.

If the divisor M is set high, the correction value to the peak shift advantageously becomes low and a response to a phase shift becomes low, as well. Conversely, if the divisor M is set low, a response to the phase shift becomes high and a correction value to the peak shift becomes high, as well. The divisor M=2 is appropriate for normally reading a floppy disk.

In the above-stated example, description has been given while taking a case where the number N of phase differences to be averaged is 2, as an example. The number N may be set higher. By setting the number N higher, a response to the peak shift becomes low but a response to the sudden phase shift and to a frequency change becomes low, as well. If it is expected, as input data characteristics, that a frequency deviation is relatively small and that a peak shift is relatively large, the number of N may be set high.

In the above-stated example, description has been given to a case where a phase range of ±1 is set.

This range may be set narrow if it is expected that an input data string has a relatively large peak shift and may be set wide if it is expected that a frequency deviation rather than the peak shift is relatively large.

Further, if the direction of the frequency deviation of an input data string is expected in advance from the characteristics of the drive or the like, the range may be set to be laterally uneven with respect to the central value of the WINDOW pulse. Namely, if the cycle of the input data string is expected to be longer than an ideal cycle, this range may be set not at ±1 with respect to the central value but at −1 to +2 with respect to the central value.

(Another Embodiment)

In the embodiment of the present invention stated above, description has been given to a case where the transfer rate is 500 Kbps and the system clock has a frequency of 12 MHz.

At this moment, the multiple-bit flip-flop (24) shown in FIG. 2 has an ideal frequency if being operated as a duodecimal counter.

If the system clock has a frequency of 24 MHz, the multiple-bit flip-flop (24) shown is operated as a 24-scale counter and the correction reference values D1 (17) and D2 (117) are −2 and +2 with respect to the central value, respectively, then exactly the same advantage as that in the first embodiment can be obtained. Further, if a clock having a twofold frequency is inputted to a circuit which deals with a transfer rate of 500 Kbps, it is possible to obtain a transfer rate of 1 Mbps with exactly the same constitution.

Alternatively, the correction value outputted from the average value A (114) shown in FIG. 1 may be prepared on a table in advance instead of the arithmetic operation unit (14) in the first embodiment stated above.

Figure 5:
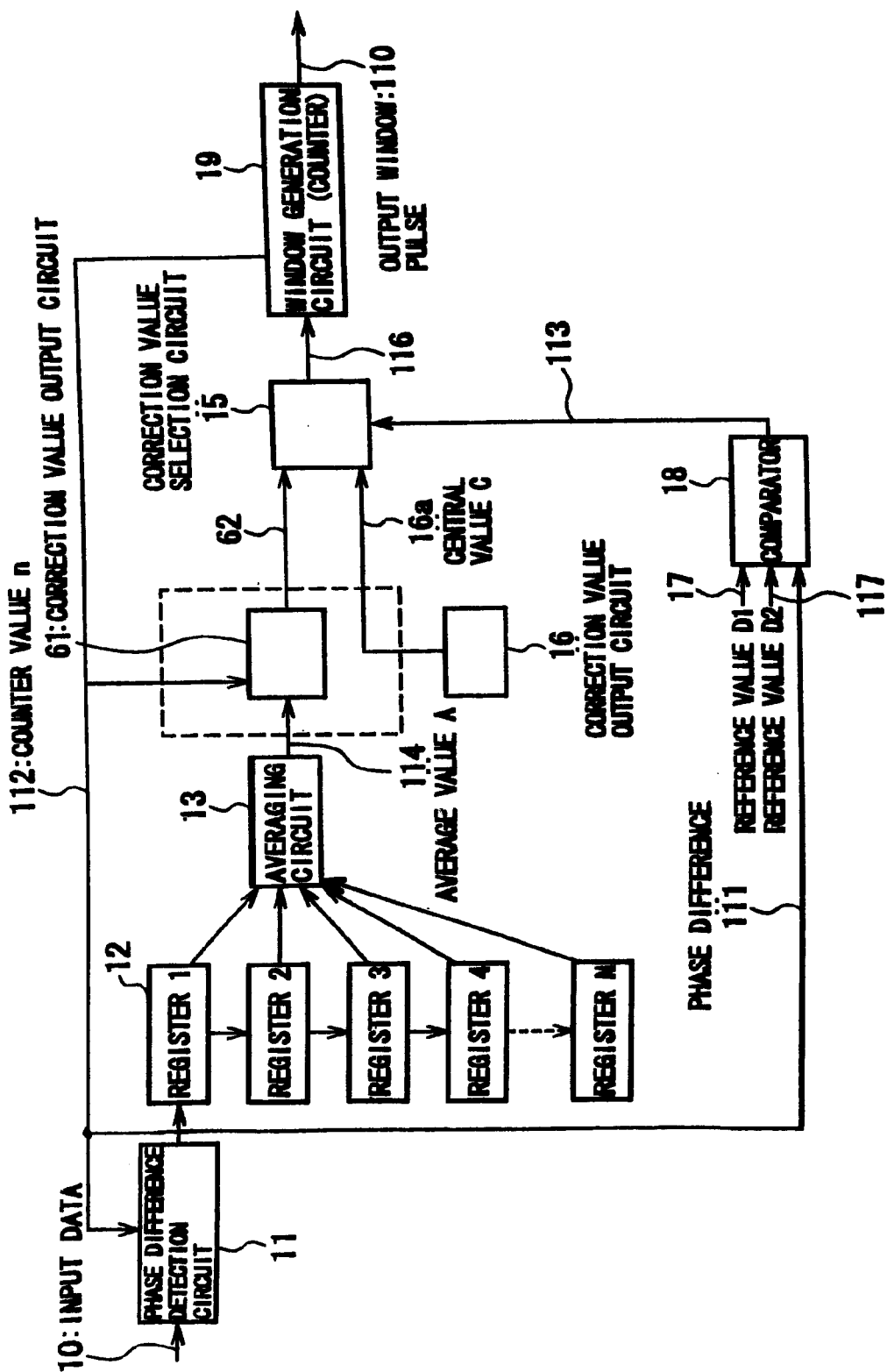
FIG. 5 is a block diagram showing another embodiment of the present invention.
Figures 6, 7:
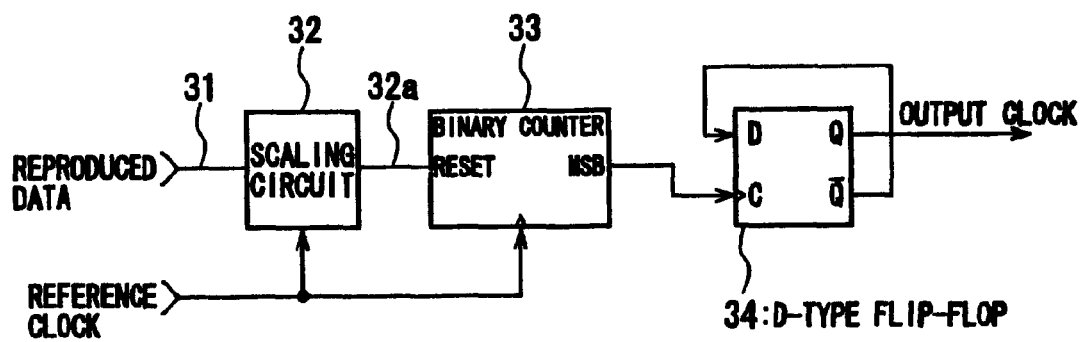
FIG. 6 is a correction table in the embodiment shown in FIG. 5.
FIG. 7 is a block diagram of a conventional device.
Figure 8:
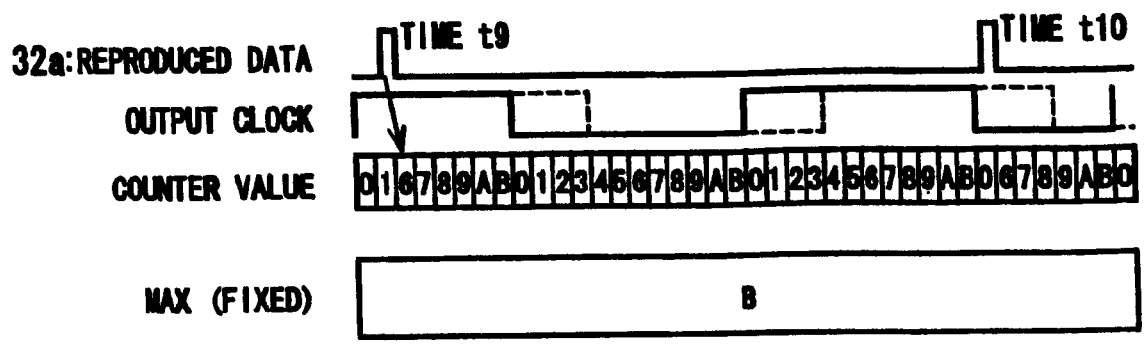
FIG. 8 shows a phase correction operation with the constitution of FIG. 7.

This embodiment is shown in FIG. 5 and one example of the relationship between the correction values (62) outputted from a correction value output circuit (61) and the average values (114) is shown in FIG. 6. The third stage of FIG. 6 indicates correction values based on {n+(C−A)/M} according to the first embodiment. In this case, "5" is assigned to C, as well.

Since the digital VFO phase control device according to the present invention is constitute as stated above, the control device can generate an ideal WINDOW pulse without being influenced by a peak shift and a sudden phase shift.

According to the conventional method in which the counter value is reset whenever input data occurs and the input data is always to be captured at the center of the WINDOW pulse, if the magnitude of the peak shift becomes equal to or higher than 25% of the High width of the WINDOW pulse, data cannot be accurately reproduced.

According to the present invention, by contrast, due to the averaging processing, a response to bits having a great phase change by one bit such as a peak shift is not so great. Due to this, in the present invention, data cannot be accurately reproduced, even if a peak shift having higher than 25% of the High width of the WINDOW pulse or more occurs.

As a phase correction method for the digital VFO, there is proposed a method as described in Unexamined Japanese Patent Publication No. 1-272324. According to this method, a maximum value is simply set for correction values, so that such a phase shift as shown in FIG. 4(c) cannot be sufficiently corrected.

Further, if the phase shift is small, a rounding error as a result of averaging occurs and a correction value becomes 0. In this state, a phase correction is not made at all, so that the relationship between the input data and the WINDOW pulse does not always converge into an ideal relationship.

According to the present invention, by contrast, the phase shift as shown in FIG. 4(c) can be sufficiently corrected. In addition, if the input data is within a range which is set near the center of the WINDOW pulse, a correction is promptly made by assigning the central value to the counter value. Thus, even in a range in which a rounding error as a result of averaging occurs, an accurate phase correction can be made.

In other words, it is advantageously possible to constitute an optimum phase correction circuit capable of dealing with both a peak shift and a sudden phase shift.

What is claimed is:

1. A digital VFO phase control device comprising:
   a counter for generating an output signal having a phase relationship with an input signal of said digital VFO phase control device,
   phase difference detection means for detecting a phase difference between the input signal and the output signal,
   first correction value output means for outputting a correction value for correcting the phase of the output signal based on the phase difference detected by said phase difference detection means,
   second correction value output means for outputting a preset correction value for correcting a the phase of the output signal,
   comparison means for detecting whether a counter value counted by said counter is within a predetermined range, and
   correction value selection means for selecting one of the correction value outputted by said first correction value output means and the correction value outputted by said second correction value output means based on the comparison result of said comparison means, and controlling the phase of the output signal utilizing the selected correction value.

2. A digital VFO phase control device according to claim 1, wherein said first correction value output means comprises phase difference averaging means for averaging phase differences detected by said phase difference detection means, and correction value calculation means for obtaining the correction value based on an average value calculated by said phase difference averaging means, said correction value calculation means including arithmetic operation means for preventing excessive correction.

3. A digital VFO phase control device according to claim 2, wherein said first correction value output means obtains the correction value from the expression {n+(C−A)/M+1}, where n is a counter value of said counter when said phase difference detection means receives the input signal, C is a pre-established value, A is an average value calculated by said phase difference averaging means, and M is a coefficient for preventing excessive correction.

4. A digital VFO phase control device according to claim 3, wherein said pre-established value C is MAX/2, where MAX is the maximum value of said counter.

5. A digital VFO phase control device according to claim 3, wherein said pre-established value C is MAX/2, where MAX is the maximum value of said counter.

6. A digital VFO phase control device according to claim 5, wherein said correction value calculation means includes arithmetic operation means for preventing excessive correction.

7. A digital VFO phase control device according to claim 1, wherein said first correction value output means comprises phase difference averaging means for averaging phase differences detected by said phase difference detection means, and correction value calculation means for obtaining the correction value based on an average value calculated by said phase difference averaging means, said correction value calculation means including arithmetic operation means for preventing excessive correction.

8. A digital VFO phase control device according to claim 1, wherein said first correction value output means obtains the correction value from the expression {n+(C−A)/M+1}, where n is a counter value of said counter when said phase difference detection means receives the input signal, C is a pre-established value, A is an average value calculated by said phase difference averaging means, and M is a coefficient for preventing excessive correction.

9. A digital VFO phase control device comprising:
a counter for generating an output signal having a phase relationship with an input signal of said digital VFO phase control device,
phase difference detection means for detecting a phase difference between the input signal and the output signal,
first correction value output means having a phase difference averaging means for averaging phase differences detected by said phase difference detection means, and a correction value calculation means for obtaining a correction value based on an average value calculated by said phase difference averaging means, so as to correct the phase of the output signal based on the phase difference detected by said phase difference detection means,
second correction value output means for outputting a present correction value for correcting the phase of the output signal,
comparison means for detecting whether a counter value counted by said counter is within a predetermined range, and
correction value selection means for selecting one of the correction value outputted by said first correction value output means and the correction value outputted by said second correction value output means based on the comparison result of said comparison means, and controlling the phase of the output signal.

10. A digital VFO phase control device according to claim 9, wherein said first correction value output means obtains the correction value from an the expression {n+(C−A)/M+1}, the value C being MAX/2,
where n is a counter value of said counter when said phase difference detection means receives the input signal, C is a pre-established value, A is an average value calculated by said phase difference averaging means, M is a coefficient for preventing excessive correction, and MAX is maximum value of said counter.

11. A digital VFO phase control apparatus comprising:
a counter for generating an output signal having a phase relationship with an input signal of said digital VFO phase control apparatus,
a phase difference detection device for detecting a phase difference between the input signal and the output signal,
a first correction value output device for outputting a correction value for correcting the phase of the output signal based on the phase difference detected by said phase difference detection device,
a second correction value output device for outputting a preset correction value for correcting the phase of the output signal,
a comparison device for detecting whether a counter value counted by said counter is within a predetermined range, and
a correction value selection device for selecting one of the correction value outputted by said first correction value output device and the correction value outputted by said second correction value output device based on the comparison result of said comparison device, and controlling the phase of the output signal utilizing the selected correction value.

12. A digital VFO phase control device according to claim 11, wherein said first correction value output device comprises a phase difference averaging device for averaging phase differences detected by said phase difference detection device, and a correction value calculation device for obtaining the correction value based on an average value calculated by said phase difference averaging device, said correction value calculation device including an arithmetic operation device for preventing excessive correction.

13. A digital VFO phase control device according to claim 12, wherein said first correction value output device obtains the correction value from the expression {n+(C−A)/M+1 }, where n is a counter value of said counter when said phase difference detection device receives the input signal, C is a pre-established value, A is an average value calculated by said phase difference averaging device, and M is a coefficient for preventing excessive correction.

14. A digital VFO phase control device according to claim 13, wherein said pre-established value C is MAX/2, where MAX is the maximum value of said counter.

* * * * *